United States Patent
Chizevsky et al.

(10) Patent No.: US 8,803,505 B2
(45) Date of Patent: Aug. 12, 2014

(54) TRANSMITTER CALIBRATION SYSTEM

(75) Inventors: William T. Chizevsky, Morrow, OH (US); Tracee Worel, Jacksonville, FL (US)

(73) Assignee: Imagine Communications Corp., Englewood, CO (US)

( * ) Notice: Subject to any disclaimer, the term of this patent is extended or adjusted under 35 U.S.C. 154(b) by 414 days.

(21) Appl. No.: 13/248,730

(22) Filed: Sep. 29, 2011

(65) Prior Publication Data

US 2013/0082687 A1    Apr. 4, 2013

(51) Int. Cl.
*G01R 19/00* (2006.01)
*G01R 35/00* (2006.01)

(52) U.S. Cl.
USPC ........................................ 324/76.11; 324/601

(58) Field of Classification Search
CPC .................. G01R 35/00; H04B 17/00–17/002; H04B 17/0062
See application file for complete search history.

(56) References Cited

U.S. PATENT DOCUMENTS

| 4,249,258 | A | | 2/1981 | Craven |
| 4,879,519 | A | * | 11/1989 | Myer ............................ 330/149 |
| 6,625,428 | B1 | * | 9/2003 | Finnell et al. .............. 455/115.1 |
| 7,053,631 | B2 | | 5/2006 | Weese |
| 7,902,836 | B2 | | 3/2011 | Kaehs |
| 8,004,269 | B1 | * | 8/2011 | Franco et al. .................... 324/95 |
| 2006/0224345 | A1 | * | 10/2006 | Ives et al. ...................... 702/107 |

FOREIGN PATENT DOCUMENTS

| EP | 0752757 A1 | 1/1997 |
| EP | 1435522 B1 | 9/2006 |

* cited by examiner

*Primary Examiner* — Vinh Nguyen
(74) *Attorney, Agent, or Firm* — Tarolli, Sundheim, Covell & Tummino LLP

(57) ABSTRACT

Systems and methods are provided for calibrating a transmitter system. A directional coupler is configured to provide a first signal representative of a forward power of an RF signal and a second signal representative of a reflected power of the RF signal. A splitting assembly is configured to generate respective third and fourth signals, each representative of the forward power, from the first signal. A switching assembly is configured to select between the second signal and the third signal. A system control is configured to determine an associated power of each of the fourth signal and a signal provided by the switching assembly.

11 Claims, 4 Drawing Sheets

TRANSMITTER CALIBRATION SYSTEM

TECHNICAL FIELD

The present invention relates to radio frequency (RF) communication systems and is particularly directed to systems and methods for calibration of transmitter systems.

BACKGROUND OF THE INVENTION

Measurement and control of RF power is a critical consideration when designing a wireless transmitter. High-power RF amplifiers rarely operate in open-loop mode, that is, where the power to the antenna is not in some way regulated. External factors, such as regulatory requirements on power transmitted, network robustness, and the need to co-exist with other wireless networks, require tight control of transmitted power. In addition to these external requirements, precise RF power control can result in improved spectral performance and can save cost and energy in the transmitter's power amplifier. In order to regulate its transmitted power, some form of calibration of the transmitter output power can be performed.

SUMMARY OF THE INVENTION

In accordance with an aspect of the present invention, a transmitter system includes a directional coupler configured to provide a first signal representative of a forward power of an RF signal and a second signal representative of a reflected power of the RF signal. A splitting assembly is configured to generate respective third and fourth signals, each representative of the forward power, from the first signal. A switching assembly is configured to select between the second signal and the third signal. A system control is configured to determine an associated power of each of the fourth signal and a signal provided by the switching assembly.

In accordance with another aspect of the present invention, a method is provided for calibrating a power monitoring system for a radio frequency (RF) transmitter. A first signal, representing a forward power of the transmitter, is provided. A second signal, representing a reflected power of the transmitter, is provided. The first signal is split to provide a third signal and a fourth signal. Each of the fourth signal and the second signal is provided to a system control when the system is monitoring the reflected power. Each of the fourth signal and the third signal are provided to the system control when the system is performing a calibration of a reflected signal path.

In accordance with yet another aspect of the present invention, a transmitter system includes a directional coupler assembly, implemented as a printed circuit board. The directional coupler assembly includes a directional coupler configured to provide a first signal representative of a forward power of an RF signal at a first port and a second signal representative of a reflected power of the RF signal at a second port, a first fixed attenuator operatively connected to the first port, and a second fixed attenuator operatively connected to the second port, with the first and second attenuators being configured to provide a same amount of relative decrease in respective signal powers of the first and second signals. A splitting assembly is configured to generate respective third and fourth signals, each representative of the forward power, from the first signal. A switching assembly is configured to select between the second signal and the third signal. A system control configured to determine an associated power of each of the fourth signal and a signal provided by the switching assembly. The system control includes a first root mean square (RMS) detector configured to determine an RMS power of the fourth signal, and a second root mean square (RMS) detector to determine an RMS power of the signal provided by the switching assembly. A first analog-to-digital converter provides a first digital value from the RMS power of the fourth signal to a microcontroller, and a second analog-to-digital converter provides a second digital value from the RMS power of the signal provided by the switching assembly to the microcontroller. The microcontroller is configured to correct each of the first digital value and the second digital value for a frequency response of the directional coupler assembly.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
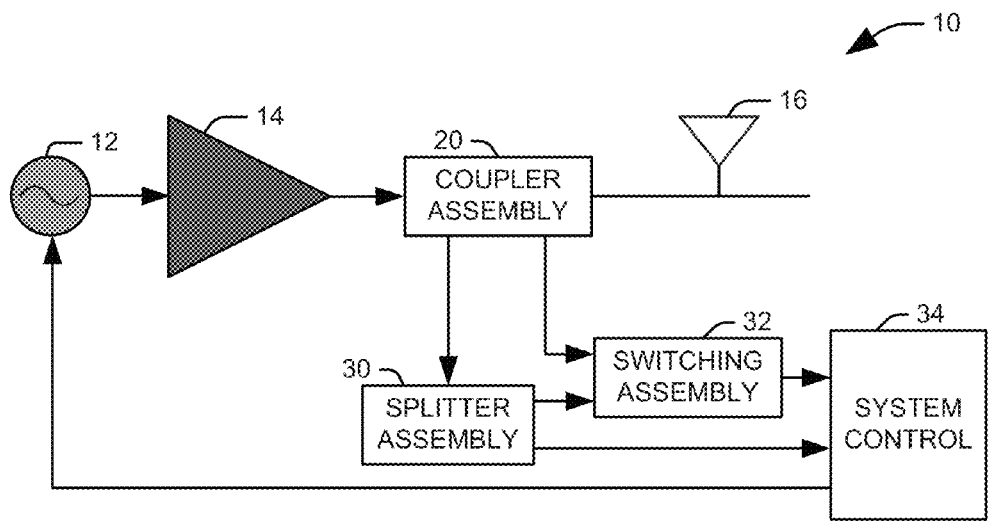
FIG. 1 is a functional block diagram of a transmitter system in accordance with an aspect of the present invention.

FIG. 1 is a functional block diagram of a transmitter system 10 in accordance with an aspect of the present invention. The system includes an exciter 12 that provides an RF signal to a power amplifier 14 for amplification. The amplified signal is then provided to an antenna 16 for transmission through a directional coupler assembly 20. It will be appreciated that the RF signal provided from the amplifier will have an associated power, referred to herein as a forward power, and a certain amount of power reflected at the antenna, referred to herein as a reflected power.

The directional coupler assembly 20 provides a first signal, representing the forward power at a first port, and a second signal, representing the reflected power, at a second port. The first signal is provided to a splitter assembly 30, which provides respective third and fourth signals from the first signal. For example, the splitter assembly 30 can evenly divide the first signal such that the third and fourth signals are substantially replicas of the first signal at a power three decibels below that of the first signal. The third signal can be provided as a first input to a switching assembly 32. The fourth signal can be provided to a system control 34 to allow for the forward power to be monitored.

The second signal can be provided as a second input to the switching assembly 32, and the switching assembly can be configured as to selectively provide either the second signal, representing the reflected power, or the third signal to the system control 34. For example, the switching assembly 32 can be controllable by the system control 34 to provide the second signal during normal operation, and the third signal during a calibration mode of the system.

During normal operation, the system control 34 can receive the first signal and the second signal and, from these signals, monitor the forward power and the reflected power to ensure that they remain within respective acceptable ranges. When either of the forward power or the reflected power deviates from the acceptable range, corrective measures can be taken, including adjusting a gain of the power amplifier 14, notifying a local or remote operator, or shutting down the system 10.

In accordance with an aspect of the present invention, the system control 34 can instruct the switching assembly 32 to provide the third signal for calibration purposes. In a normally functioning system, the reflected power, represented by the second signal, is too weak for use in calibration. To provide a signal of sufficient strength, the third signal can be generated from the first signal such that it has a known power sufficient for calibration. Specifically, the forward power of the signal can be determined, for example, via an external power meter, and the power of the third signal can be determined from the known forward power and properties of components comprising the directional coupler assembly 20, the splitter assembly 30, and the switching assembly 32.

Figure 2:
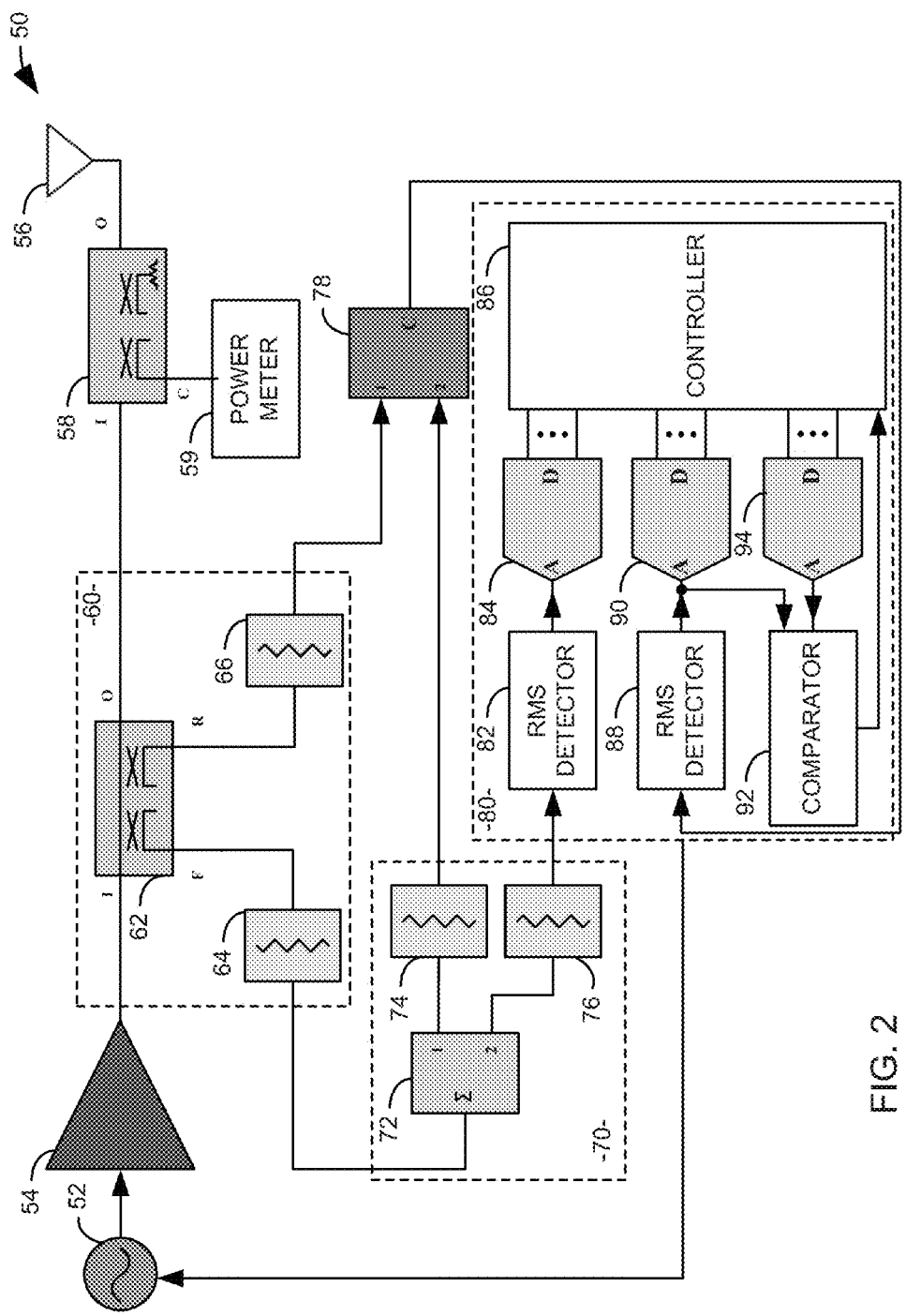
FIG. 2 illustrates one implementation of a transmitter system in accordance with an aspect of the present invention.

FIG. 2 illustrates one implementation of a transmitter system 50 in accordance with an aspect of the present invention. The system includes an exciter 52 that provides an RF signal to a power amplifier 54 for amplification. The amplified signal is then provided to an antenna 56 for transmission. A first directional coupler 58 can be interposed between the power amplifier 54 and the antenna 56 and configured to provide a signal representing the forward power of the RF signal to an external power meter 59. Using the external power meter 59, the forward power of the transmitter system 50 can be determined with precision.

A directional coupler assembly 60 can also be interposed between the amplifier 54 and the antenna 56. The directional coupler assembly 60 includes a second directional coupler 62 in a bidirectional configuration to provide a first signal, representing the forward power at a first port, and a second signal, representing the reflected power, at a second port. In accordance with an aspect of the present invention, the second directional coupler 62 and two fixed RF attenuators 64 and 66 implemented are on a common circuit board.

In the illustrated system, a first attenuator 64 is directly connected to the first port and a second attenuator 66 is directly connected to the second port. The coupling structure of the second directional coupler 62 is configured to be symmetrical, such that the coupling factors provided for the forward and reflected powers are substantially equal. The first and second attenuators 64 and 66 can be selected to provide a similar attenuation to the two signals, such that the relative decrease in power provided by each attenuator is substantially equal. By selecting the attenuators to provide a good return loss and precise and equal attenuation at both ports of the second directional coupler 62, the directivity of the coupling assembly and the accuracy of calibration are significantly enhanced.

The first signal, which represents the forward power, is split at splitting assembly 70 to form third and fourth signals. The splitting assembly 70 can include a two-way RF splitter 72 configured to provide an even split of the first signal into two signals of substantially even power. For example, the two-way RF splitter 72 can be implemented as a small surface-mount technology (SMT) device selected for good return loss and repeatable performance over the transmitter's 50 operating frequency.

The splitting assembly 70 can further include respective third and fourth attenuators 74 and 76 configured to attenuate the third and fourth signals, respectively. Via the third and fourth attenuators 74 and 76, the power of the third and fourth signals leaving the splitting assembly 70 can be controlled to produce signals padded to an appropriate level for analysis. It will be appreciated that the attenuation applied at the third and fourth attenuators 74 and 76 can be unequal. Further, the signal strength can be precisely controlled for calibration and tracking purposes. For example, the coupling factor of the directional coupler 62, the loss at the splitter 72, and the losses at the first and third attenuators 64 and 74 are known. Since the forward power is determined via the common calibration routine, described below, the power of the third signal can be determined with sufficient precision for calibrating the system 50 for monitoring the reflected power. The third signal is provided to a switching assembly 78 as a first input, and the second signal, which represents the reflected power, is provided as a second input to the switching assembly. For example, the switching assembly 78 can be configured as a two-way integrated circuit absorptive switch, controllable by a system control 80 to selectively provide either the second signal or the third signal to the system control. The use of an absorptive switch configuration provides proper termination of the de-selected signal paths and ensures the highest calibration accuracy by minimizing variations in signal path loss when switching between normal and calibration modes. When the switching assembly 78 is in a first position, the switching assembly provides the second signal to the system control 80 to allow the reflected power to be monitored. When the switching assembly 78 is switched to a second position, a power sample from the third signal, with its known dB ratio to the forward power of the transmitter 50 is provided to the system control. It will be appreciated that the switching assembly 78 can be selected to exhibit nearly identical insertion loss in both positions, and thus may be factored out of the calibration.

The fourth signal, representing the forward power of the transmitter 50, and the output of the switching assembly 78 are provided to the system control 80. The fourth signal is provided to a first root-mean-square (RMS) detector 82 that converts the signal to a direct current (DC) sample. The DC sample is provided to a first analog-to-digital converter (ADC) 84, and the resulting digital value, representing the forward signal power, is provided to a microcontroller 86. The microcontroller 86 can continuously monitor the third signal to ensure that the forward power does not deviate from the desired range.

In normal operation, the second signal, representing the reflected power of the transmitter 50, is provided from the switching assembly 78 a second RMS detector 88 that converts the signal to a DC sample. The DC sample is provided to a second ADC 90. The second ADC 90 generates a digital value representing the reflected signal power, and provides it to the microcontroller 86. The microcontroller 86 can thus continuously monitor the second signal to ensure that the reflected power does not deviate from the desired range.

Similarly, the microcontroller 86 can provide a threshold power to a comparator 92 though a digital-to-analog converter 94, representing a reflected power at which it is necessary to shut down the transmitter 50 to prevent damage to transmitter components. This threshold can be set during the reflected power calibration process, described below. The DC output from the second RMS detector 88 is split and buffered and, in addition to feeding the second ADC 90, also feeds the conditional input of the comparator 92. Any measured reflected power exceeding this threshold will indicate a fault to the controller which mutes the RF Output and shuts the system down quickly to prevent damage to the transmission system. The use of a hardware comparator provides faster response to sudden events of excessive reflected power than the periodic ADC polling can provide, thus maximizing system protection. Slower, more long-term effects such as antenna icing, etc, are handled through sampling and power foldback at the controller 86, while sudden events are handled by the hardware comparator-invoked shutdown.

An initial factory calibration can be performed for simultaneous calibration of the forward power detection and the reflected power detection at mid-band, that is, in the center of a frequency band of operation of the transmitter, at two power points. The transmitter forward power is first set to its lowest operating power, as indicated on the external power meter 59. The controller 86 then instructs the switching assembly 78 to switch to the second position and inject the attenuated forward sample into the system control 80. Since the coupling structure is symmetrical, this point can be calibrated as the forward power (in dBm) less a path loss (dB), where path loss is a constant obtained from design characterization of the path loss of the application circuit from the input of splitting assembly 70 to the input of the switching assembly 78. Since the switching assembly is common to the calibration signal (i.e., the third signal) and actual reflected path (i.e., the second signal), it is automatically factored out during calibration. The system controller stores both A/D sampled forward power 82 and reflected power 88 detector values in memory and returns the switching assembly 78 to the first position.

The transmitter 50 is then raised to full power, as determined on the external power meter 59, and the process is repeated. The system 50 utilizes detector integrated circuits with a DC output slope in mV/dB. The detector slope is then found from the ratio of the voltage difference between the detected value at full power and the detected value at low power to an operational power range utilized for calibration, in decibels. Thus, in one procedure, detector slopes for each of the forward power and the reflected power detectors can be independently yet simultaneously characterized and the system calibrated over the transmitter system's operating power range, provided this is within the usable range of the various components of the system control 80. Following the initial calibration, the controller 86 will write out an appropriate reflected power fault threshold voltage, via the digital-to-analog converter 94, to the comparator 92.

In accordance with an aspect of the present invention, the controller 86 can provide a frequency correction to the detected power levels the such that once the detector slopes have been established through the two-point calibration process, the transmitter 50 may be changed to any frequency in the band and still exhibit acceptable power accuracy without requiring recalibration. When the operating bandwidth is small compared to a bandwidth of the RMS detectors 82 and 88, the derived slope can be assumed accurate over the operating bandwidth. Therefore, equations or a Look-Up Table (LUT) derived from a measured response of the directional coupler assembly 60, as well as any associated cable loss and RMS detector circuit 82 and 86 frequency dependent response, can be used to predict a change in the coupling factor with a change of transmitter frequency.

For example, the system coupler, cables, and portions of the detector PWB are included in measured response data and fit to the compensation equation. This equation is used in the system controller, along with the reference calibration data, to correct for system coupler response on a change of frequency and maintain system output power without requiring a re-calibration. Additional factors, such as any harmonic filtering performed in the reflected path, can be implemented as a separate equation or lumped with this data set to form an aggregate correction specific to the reflected path. Any such response factors, including temperature dependencies, can be included in the response correction.

To this end, the coupling assembly 60 can be implemented as a printed coupling structure selected to exhibits excellent unit-to-unit repeatability. The second directional coupler 62 tends to hold their relative curve very accurately, with any variance typically an overall shift in the Y-axis. High quality attenuator pads are used for the first and second attenuators 64 and 66, which exhibit excellent repeatability and thermal stability, although thermal drift can be corrected for as well when temperature sensors (not shown) are present in the design. The overall shift of the coupling curve is factored out in the initial calibration and may thereafter be disregarded. On a change of frequency, the curve-fitting equations are run at the reference calibration frequency and the new frequency of operation. Using the known operating range from the calculated coupling factor, the controller 86 can adjust the minimum and maximum detector values defining the typical range of operation up or down to accommodate the new frequency of operation.

The frequency correction applied at the controller 86 provides accurate power measurements despite a change of frequency without requiring re-calibration. The measured reflected power will be subject to a window of uncertainty governed primarily by the directivity of the coupling structure 60, which is enhanced through the use of the on-board attenuators 64 and 66 as well as limited cabling between the coupling structure 60 and the other components 70, 78, and 80 of the system. The window of uncertainty, RL±ϵ, for the measured return loss, for a given coupler directivity and actual return loss, is given by the equation:

$$RL \pm \varepsilon = -20 \log_{10}\left(10^{\frac{-RL}{20}} \pm 10^{\frac{-DIR}{20}}\right) \qquad \text{Eq. 1}$$

where RL is Return Loss and DIR is coupler directivity, both expressed in dB.

It will be appreciated that tradeoffs can be made between a required reflected power measurement accuracy and coupler directivity/cost. The step accuracy between the high and low calibration points is largely a function of the linearity (ripple) error of the RMS detectors 82 and 88, and again, tradeoffs can be made with regard to required performance versus cost. Once a reference calibration has been performed, and thus the slope established, a touch-up calibration, referred to as a field calibration is available if the user should wish to perform an online calibration for whatever reason. In the field calibration mode, the user can calibrate the system against an external power meter at an actual operating power level if absolute accuracy at a certain power level is desired. This can be performed during operation as a single step, and since the slope was already established in the reference calibration, only a single point needs to be taken, the actual operating power. The controller 86 then reconstructs the minimum and maximum points using the stored slope and single point. On a subsequent change of frequency, the system reverts to using the corrected reference calibration data. A new two-point reference calibration can be performed at any time, but it is intended that the one-point calibration be used in the field situation as it is performed only at the operational power and does not interrupt system operation.

With today's power meters being remote capable, and since nothing is physically reconfigured for this procedure, the transmitter system 50 calibration could be performed remotely without personnel present, a great advantage for remote sites. Further, the proposed system and calibration method streamlines the process both in the factory and field setting to save cost on manufacturing test time and field upkeep, and minimize maintenance downtime.

Figure 3:
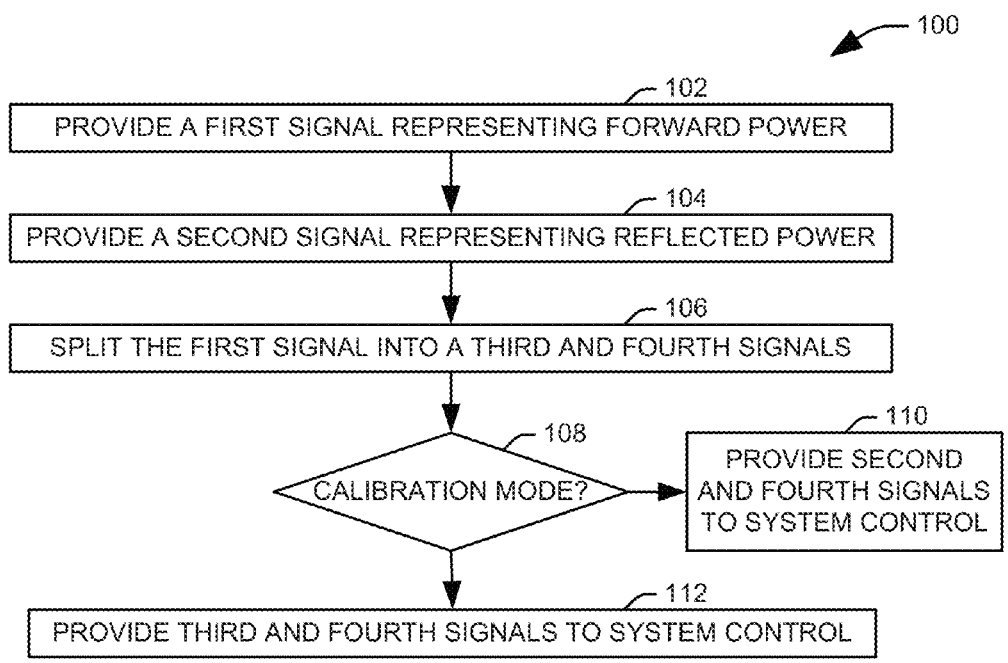
FIG. 3 illustrates one implementation of a method for operating a transmitter in accordance with an aspect of the present invention.

FIG. 3 illustrates one implementation 100 of a method for operating a transmitter in accordance with an aspect of the present invention. At 102, a first signal is provided, representing a forward power of the transmitter. At 104, a second signal is provided, representing a reflected power of the transmitter. For example, the forward and reverse powers can be provided through a directional coupler arrangement.

At 106, the first signal is split to provide a third signal and a fourth signal. At 108, it is determined if the system is currently in a calibration mode. If not (N), the system is monitoring the forward and actual reflected power, and each of the fourth signal and the second signal are provided to a system control at 110. If the system is in calibration mode (Y), each of the fourth signal and the third signal are provided to the system control at 112. For example, the system control can control a switching assembly to sample the third signal when the system is performing a calibration of the reflected signal path.

In one implementation, the system control can include both a software-implemented controller and a hardware comparator for monitoring the reflected power. In this implementation, the controller can perform a frequency correction of the second signal according to a frequency response of the received signal path, and in particular, the directional coupler arrangement. In such a system, along with adjusting the behavior of the transmitter to maintain the second signal within a desired range defined by the calibration, the second signal can be compared to a reflected power fault threshold at the comparator, and transmission of the RF signal can be immediately ceased to prevent damage to the transmitter if the second signal exceeds the reflected power fault threshold.

Figure 4:
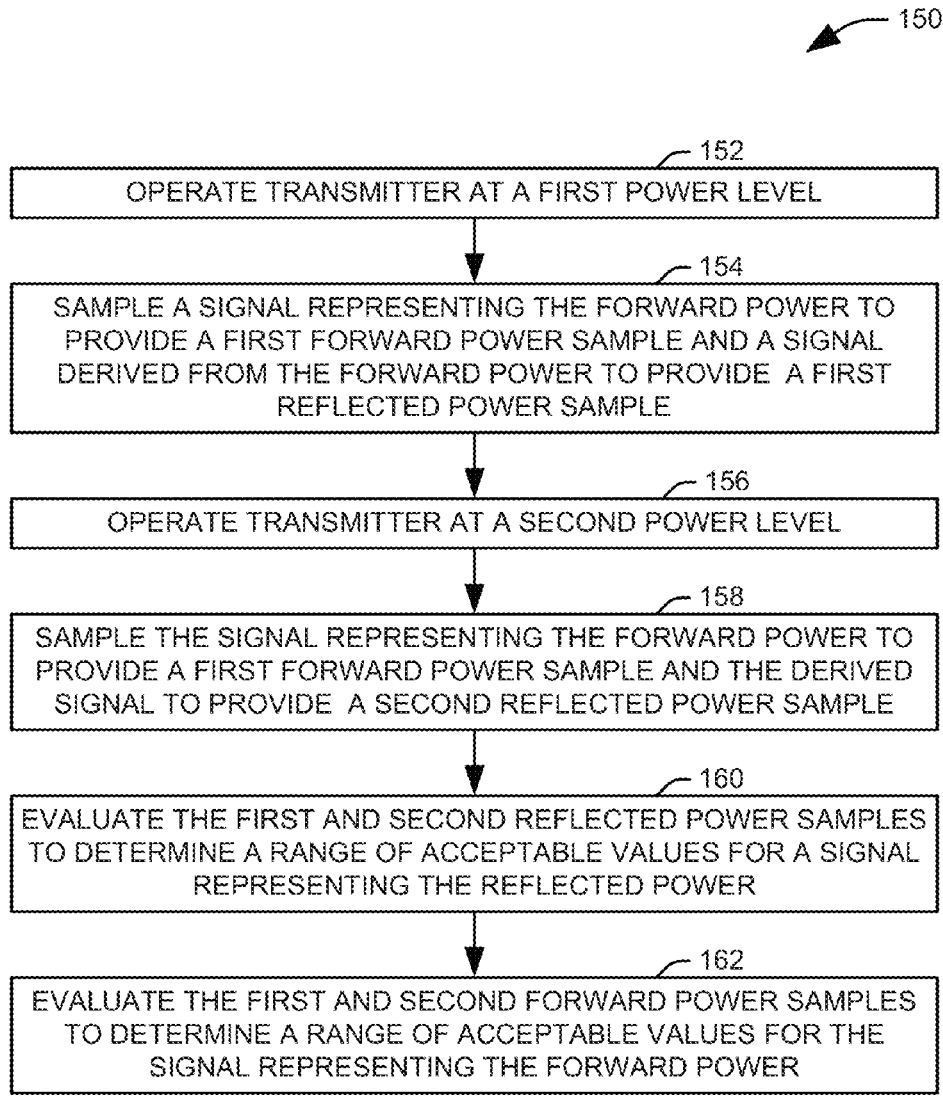
FIG. 4 illustrates one implementation of a method for performing a calibration of a reflected signal path.

FIG. 4 illustrates one implementation of a method 150 for performing a simultaneous calibration of a forward and reflected signal path for a transmitter such as that described in FIG. 3. At 152, the transmitter is operated at a first power level. At 154, each of a signal representing the forward power, such as the fourth signal in FIG. 3, and a signal derived from the forward power of the transmitter, such as the third signal in FIG. 3, is sampled at the first power level to produce a first forward power sample and a first reflected power sample. At 156, the transmitter is operated at a second power level. At 158, each of the signal representing the forward power and the derived signal is sampled at the second power level to produce a second forward power sample and a second reflected power sample. The first reflected power sample and the second reflected power sample are evaluated at 160 to construct a range of acceptable values for a signal representing the reflected power, such as the second signal of FIG. 3. For example, this evaluation can include determining a slope value as the ratio of the difference between the first reflected power sample and the second sample to a difference between the first power level and the second power level. At step 162, the first forward power and the second forward power sample can be evaluated to provide a range of accepted values for the signal representing the forward power and a separate calibration slope for the forward power.

Figure 5:
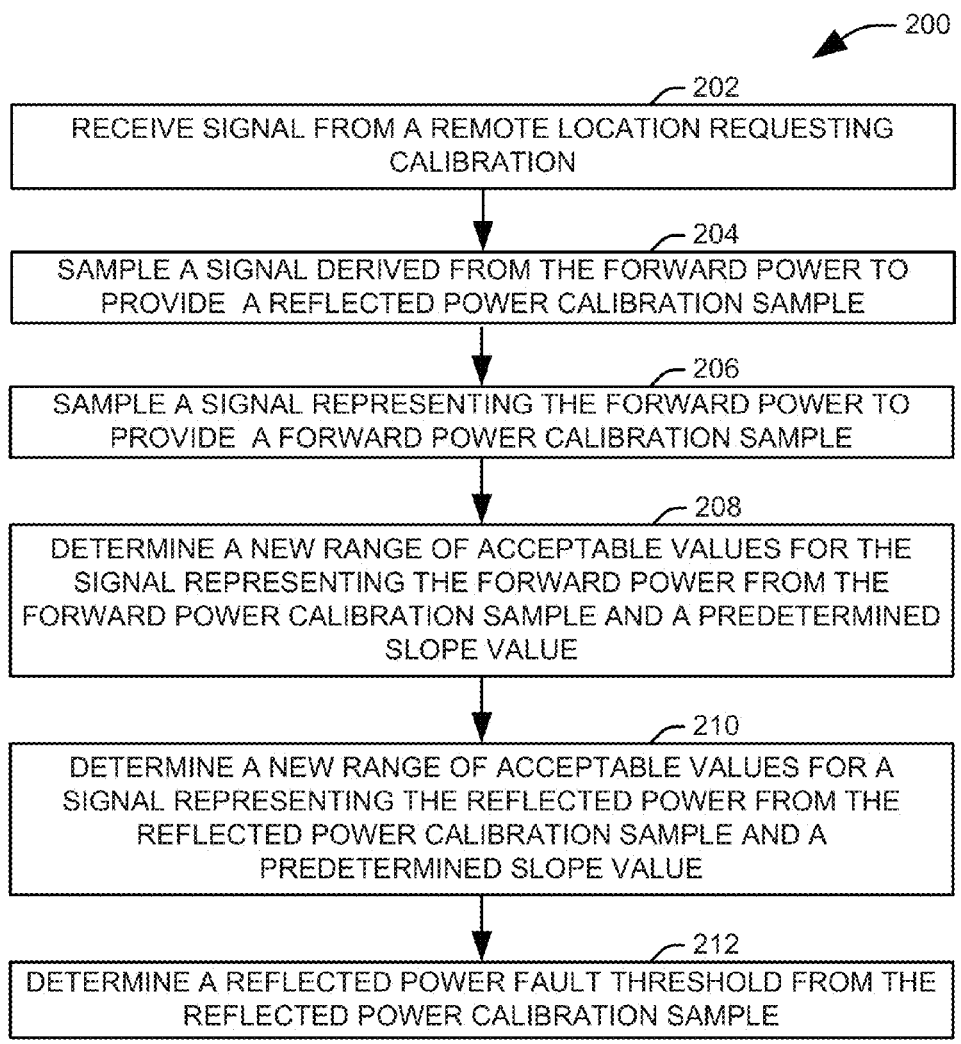
FIG. 5 illustrates one implementation of a methodology for a touch-up calibration.

In one implementation, once the above calibration process is performed, a second calibration process can be performed while the transmitter is operating. FIG. 5 illustrates one implementation of a methodology 200 for this calibration, referred to as a "touch-up" calibration. At 202, a signal is received at the system control from a remote location indicating that a calibration process should be initiated. At 204, a signal derived from the forward power, such as the third signal in FIG. 3, is sampled to produce a reflected power calibration sample. At 206, a signal representing the forward power, such as the fourth signal in FIG. 3, is sampled to produce a forward power calibration sample. At 208, a new range of acceptable values is determined for the signal representing the forward power from the calibration sample and a predetermined slope value. At 210, a new range of acceptable values is determined for a signal representing the reflected power, such as the second signal in FIG. 3, from the reflected power calibration sample and a predetermined slope value. At 212, a reflected power fault threshold is determined from the reflected power calibration sample, such that when the reflected power exceeds the determined threshold, the transmitter will be shut down to avoid damage to transmitter components.

From the above description of the invention, those skilled in the art will perceive improvements, changes, and modifications. Such improvements, changes, and modifications within the skill of the art are intended to be covered by the appended claims.

Having described the invention we claim:

1. A transmitter system comprising:
   a directional coupler assembly configured to provide a first signal representative of a forward power of an RF signal and a second signal representative of a reflected power of the RF signal;
   a splitting assembly configured to generate respective third and fourth signals, each representative of the forward power, from the first signal;
   a switching assembly configured to select between the second signal and the third signal; and
   a system control configured to determine an associated power of each of the fourth signal and a signal provided by the switching assembly.

2. The system of claim 1, the directional coupler assembly being implemented as a printed circuit board assembly comprising:
   a directional coupler configured to provide the first signal at a first port and the second signal at a second port;
   a first fixed attenuator operatively connected to the first port; and
   a second fixed attenuator operatively connected to the second port, the first and second attenuators being configured to provide a same amount of relative decrease in respective signal powers of the first and second signals.

3. The transmitter system of claim 1, the splitting assembly comprising an RF signal splitter configured to generate the third and fourth signals from the first signal, a first attenuator configured to reduce the third signal to an appropriate level for analysis at the system control, and a second attenuator configured to reduce the fourth signal to an appropriate level for analysis at the system control.

4. The transmitter system of claim 1, the system control comprising a comparator that receives the second signal and compares it to a threshold value representing a maximum permissible value for the reflected power.

5. The transmitter system of claim 4, the system control comprising a microcontroller and a digital-to-analog converter, the microcontroller providing the threshold value to the comparator through the digital-to-analog converter and the comparator providing an output to the microcontroller.

6. The transmitter system of claim 1, the system control comprising a first root mean square (RMS) detector to determine an RMS power of the fourth signal and a second root mean square (RMS) detector to determine an RMS power of the signal provided by the switching assembly.

7. The transmitter system of claim 6, the system control comprising a first analog-to-digital converter to provide a first digital value from the RMS power of the fourth signal to an microcontroller and a second analog-to-digital converter to provide a second digital value from the RMS power of the signal provided by the switching assembly to the microcontroller.

8. The transmitter system of claim 6, the microcontroller being configured to correct each of the first digital value and the second digital value for a frequency response of the directional coupler assembly.

9. The transmitter system of claim 1, further comprising:
a second directional coupler assembly configured to provide a coupled signal representing the forward power; and
an external power meter configured to determine a value for the forward power from the coupled signal.

10. A transmitter system comprising:
a directional coupler assembly, implemented as a printed circuit board and comprising:
a directional coupler configured to provide a first signal representative of a forward power of an RF signal at a first port and a second signal representative of a reflected power of the RF signal at a second port;
a first fixed attenuator operatively connected to the first port; and
a second fixed attenuator operatively connected to the second port, the first and second attenuators being configured to provide a same amount of relative decrease in respective signal powers of the first and second signals;
a splitting assembly configured to generate respective third and fourth signals, each representative of the forward power, from the first signal;
a switching assembly configured to select between the second signal and the third signal; and
a system control configured to determine an associated power of each of the fourth signal and a signal provided by the switching assembly, the system control comprising:
a first root mean square (RMS) detector to determine an RMS power of the fourth signal;
a second root mean square (RMS) detector to determine an RMS power of the signal provided by the switching assembly;
a microcontroller;
a first analog-to-digital converter to provide a first digital value from the RMS power of the fourth signal to the microcontroller; and
a second analog-to-digital converter to provide a second digital value from the RMS power of the signal provided by the switching assembly to the microcontroller;
wherein the microcontroller is configured to correct each of the first digital value and the second digital value for a frequency response of the directional coupler assembly.

11. The transmitter system of claim 10, the system control further comprising a comparator that receives the second signal and compares it to a threshold value representing a maximum permissible value for the reflected power.

* * * * *